United States Patent [19]

Holcomb et al.

[11] Patent Number: 5,054,118
[45] Date of Patent: Oct. 1, 1991

[54] BALANCED MIXER UTILIZING FILTERS

[75] Inventors: Don R. Holcomb, Scottsdale; David M. Zelinka, Fountain Hills, both of Ariz.

[73] Assignee: Motorola, Inc., Schaumburg, Ill.

[21] Appl. No.: 318,103

[22] Filed: Mar. 2, 1989

[51] Int. Cl.$^5$ .............................................. H04B 1/26
[52] U.S. Cl. .................................. 455/326; 329/344; 455/330
[58] Field of Search ............... 455/307, 317, 319, 320, 455/322, 323, 325, 326, 327, 330; 329/340, 344; 333/25, 175, 176

[56] References Cited

U.S. PATENT DOCUMENTS

| | | | |
|---|---|---|---|
| 3,493,870 | 2/1970 | Kupfer | 455/320 |
| 4,355,420 | 10/1982 | Ishihara | 455/317 |
| 4,864,644 | 9/1989 | Takahashi et al. | 455/326 |

FOREIGN PATENT DOCUMENTS

| | | | |
|---|---|---|---|
| 0136214 | 10/1979 | Japan | 455/326 |
| 0174505 | 9/1985 | Japan | 455/317 |
| 0136112 | 6/1987 | Japan | 455/326 |

Primary Examiner—Reinhard J. Eisenzopf
Assistant Examiner—Chi H. Pham
Attorney, Agent, or Firm—Robert M. Handy; Maurice J. Jones

[57] ABSTRACT

A mixer circuit has a first filter connected between a local oscillator terminal and a node and another filter connected between a RF signal terminal and the node. A first circuit path extends from the node through a first diode to a first tuned circuit which can be connected to an input terminal of a balanced-to-unbalanced converter. A second circuit path extends from the node through an oppositely disposed diode which is connected to another tuned circuit which can be connected to another input terminal of the balanced-to-unbalanced converter. The diodes alternately conduct in response to opposite half cycles of the local oscillator signal and the RF signal to generate a variety of mixing components. The tuned circuits preserve the desired output signal and attenuate the other mixing components.

14 Claims, 1 Drawing Sheet

BALANCED MIXER UTILIZING FILTERS

BACKGROUND OF THE INVENTION

The present invention relates generally to mixer circuits and particularly to such circuitry utilizing filter circuits.

Modern high frequency communication systems such as transceivers or equipment for testing such systems often include frequency converter or mixer circuits which can perform a variety of functions. For instance, it is desired that mixing circuitry be utilized in transceivers for providing an intermediate frequency (IF) signal at a first terminal in response to a local oscillator signal applied to a second terminal and a radio frequency (RF) input signal applied at a third terminal, when such equipment is operated in a "receive mode". It is also desired that the same circuitry be usable for converting the frequencies of a modulated signal applied to the first terminal to provide a desired output signal at the third terminal, when such equipment is operated in a "transmit mode" or as a signal generator.

Generally, prior art circuitry for performing mixing functions at frequencies of between 1 and 3 gigahertz ($GH_z$) utilize complex, broadband transformers for cancelling unwanted signals. These transformers are expensive and tend to take up space and add excessive additional weight. Furthermore, some prior art systems require redundant circuitry to perform the functions of the above described "receive" and "transmit" modes.

SUMMARY OF THE INVENTION

Accordingly, it is an object of the present invention to provide balanced mixer circuitry which does not require that broadband transformers be utilized therein.

The above and other objects and advantages of the present invention are carried out in one form by providing mixer circuitry having a first filter connected between a local oscillator and a node and another filter connected between a RF signal terminal and the node. A first circuit path extends from the node through a first diode to a first tuned circuit which is also connected to an input terminal of a balanced-to-unbalanced converter. A second circuit path extends from the node through an oppositely disposed diode which is connected to another tuned circuit that is also connected to another input terminal of the balanced-to-unbalanced converter. The diodes alternately conduct in response to opposite half cycles of the local oscillator signal to nonlinearly combine the frequencies of the local oscillator and input signal to generate a variety of mixing components. The tuned circuits select and preserve the desired output signal and attenuate the other mixing components. As a result, the desired output signal is applied to the balanced-to-unbalanced converter.

BRIEF DESCRIPTION OF THE DRAWING

A more complete understanding of the present invention can be derived by referring to the detailed description and claims when considered along with the accompanying drawings.

DETAILED DESCRIPTION OF THE PREFERRED EMBODIMENT

Figure 1:
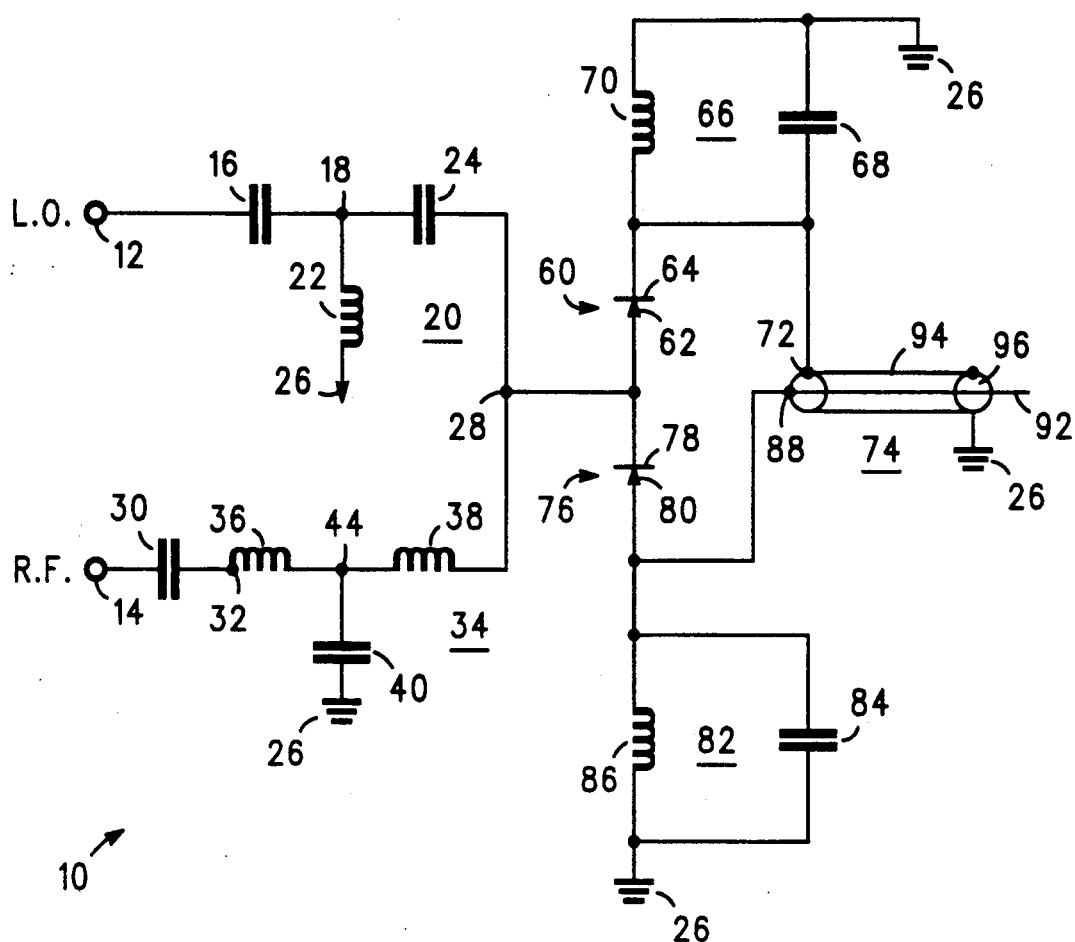
FIG. 1 is a schematic diagram of an embodiment of a balanced filter circuit in accordance with the present invention.

Referring now to the drawings, FIG. 1 shows a schematic diagram of a balanced mixer 10 having a local oscillator input terminal 12 and a RF signal terminal 14. Input capacitor 16 is connected to terminal 18 of high pass filter 20 which also includes inductor 22 and capacitor 24. More specifically, inductor 22 is connected between terminal 18 and a ground or reference conductor 26. Capacitor 24 couples terminal 18 to node 28. High pass filter 20 is designed to provide a low impedance for the local oscillator signal which can be tunable from 1,710.4 megahertz ($MH_z$) to 2,710 $MH_z$, for instance.

Direct current (DC) blocking input capacitor 30 is connected between RF signal terminal 14 and terminal 32 of low pass filter 34 which also includes inductors 36 and 38 that are connected in series between terminal 32 and node 28. Inductors 36 and 38 are connected at node 44 and capacitor 40 is connected from node 44 to ground or reference conductor 26. Low pass filter 34 is designed to provide a low impedance path between terminals 14 and 28 for signals having frequencies of between 0.4 $MH_z$ to 1000 $MH_z$, for instance.

Inductor 38 tends to provide a high impedance at node 28 to signals passed by high pass filter 20 thereby enhancing the high pass function of filter 20. Furthermore, capacitor 24 provides a high impedance at node 28 to the signals passed by low pass filter 34 thereby enhancing the operation of filter 34.

Figure 2:
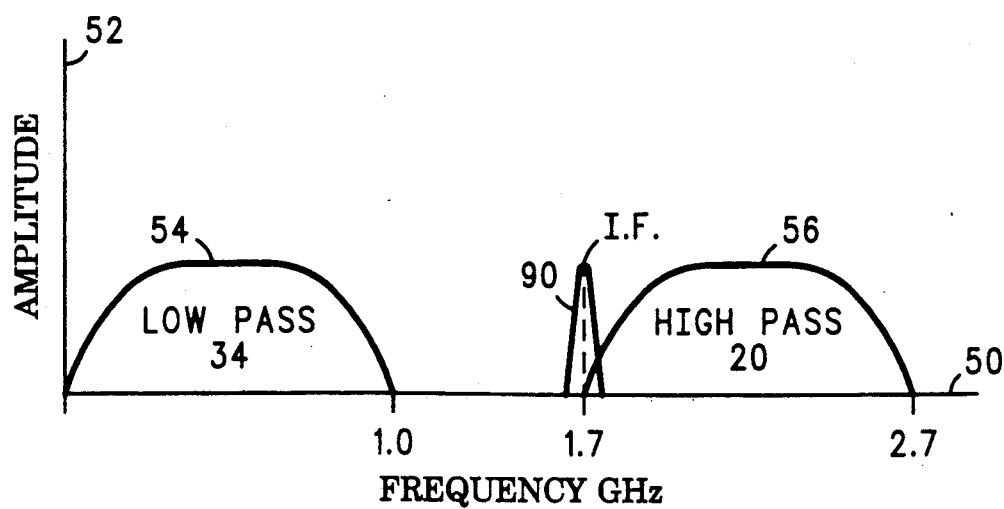
FIG. 2 is a graph of the bandpass characteristics of the filters and tuned circuits of FIG. 1.

FIG. 2 illustrates relative amplitude versus frequency in $GH_z$ characteristics of filters 20 and 34. More specifically, FIG. 2 shows a graph having an abscissa axis 50 for measuring frequency and an ordinate axis 52 for measuring the amplitude of the admittances of filters 20 and 34, which are the reciprocals of the impedances of filters 20 and 34. Curve 54 represents the bandpass characteristic of low pass filter 34 and curve 56 illustrates the high pass characteristic of filter 20. Thus, FIG. 2 indicates that low pass filter 34 provides high impedances to frequencies falling within the pass band of high pass filter 20 and that high pass filter 20 provides high impedances to signals having frequencies falling within the pass band of low pass filter 34. Accordingly, the local oscillator signal applied to terminal 12 is blocked from RF signal terminal 14 by filter 34, and when circuit 10 is operated in the "receive mode", the input signal applied to terminal 14 is blocked from entering the local oscillator coupled to terminal 12 by filter 20, for instance.

Detector diode 60 includes an anode electrode 62 coupled to node 28 and a cathode electrode 64. Tuned circuit 66 includes a capacitor 68 and an inductor 70 which are connected in parallel between cathode electrode 64 and ground or reference conductor 26. The cathode 64 of diode 60 is also connected to first input terminal 72 of balanced-to-unbalanced converter 74. Another detector diode 76 includes a cathode electrode 78 connected to node 28 and an anode electrode 80 connected to tuned circuit 82. Capacitor 84 and inductor 86 are connected in parallel with each other to form tuned circuit 82 which is connected between anode 80 and ground or reference conductor 26. Anode 80 is connected to another input terminal 88 of balanced-to-unbalanced converter 74. Detector diodes 60 and 76 may be "hot carrier" diodes of a known type. Hot carrier diodes are used in circuit 10 because they provide a low capacitance and thereby a high "off" impedance when nonconductive, at the desired frequency. The high "off" impedances provided by diodes 60 and 76 tend to not load down the driving circuitry coupled thereto.

Tuned circuits 66 and 82 are each tuned to a center frequency equal to the IF center frequency which can be approximately 1.7 GH$_z$, for instance, as shown by IF bandpass characteristic 90 of FIG. 2. An IF amplifier connected to terminal 92 can have a bandpass of about 10 MHz, for instance. Hence, the tuned circuits provide a high impedance to signals in a band centered at the IF frequency while tending to provide low impedance at other frequencies including the local oscillator and RF signal frequencies.

Balanced-to-unbalanced converter 74 may be provided by a piece of 50 ohm coaxial transmission line cut to a length equal to one-quarter wavelength at the IF center frequency. Conductor 92 represents the center conductor of the coaxial cable and the surface of cylinder 94 indicates the grounded shield wire of such cable which is separated from conductor 92 by an insulator 96. Outer conductor 94 is connected to ground conductor 26. Hence, differential signals applied between terminals 72 and 88 are converted to single ended signals at terminal 92 which is referenced to the ground potential, in a known manner. Terminal 92 can be connected to either the IF amplifier in the "receive" mode or to a signal source in the "transmit" mode in a known manner.

More specifically, in either the "receive" or the "transmit" mode of operation, the local oscillator signal applied to terminal 12 has a relatively high magnitude which can on the order of 7 decibels above 1 milliwatt (dBm). This local oscillator signal is applied to terminal 12 and an RF input signal having a relatively small magnitude on the order of −10 dBm, for instance, is applied to terminal 14 in the "receive" mode. The RF input signal can be modulated to produce sidebands around the center frequency. In the "receive" mode, the output is taken from terminal 92. Alternatively, in the "transmit" mode, an RF input signal is applied to terminal 92 and the output is taken from terminal 14. In either mode, the positive going excursions of the sinusoidal local oscillator signal render diode 60 conductive and the negative going excursions of the local oscillator signal render diode 76 conductive. Because of the non-linear transfer characteristics of these diodes, the sum and difference of the frequencies of the local oscillator and RF input signals along with other frequency components are generated by this mixing action. These signal components are sampled on the positive going half cycles by tuned circuit 66 and on the negative going half cycles by tuned circuit 82. In the "receive" mode, the frequency of the local oscillator signal can be adjusted such that the difference between the frequency of the local oscillator signal and the RF input signal is within the IF band centered about the IF frequency of approximately 1.7 GH$_z$. The DC blocking capacitors 24, 30 and 40 enable the same DC current through both diodes 60 and 76 since these diodes are in series from a DC point of view. This enables the diodes to operate in a balanced manner.

Hence, the local oscillator and RF signals tend to be in phase and have equal magnitudes at the ends of tuned circuits 66 and 82 that are respectively connected to diodes 60 and 76. Therefore, these signals tend to be "balanced" or to cancel each other because of tuned circuits 68 and 82. Alternatively, the desired frequency which can be the difference between the frequencies of the local oscillator and the RF signal will be out of phase in tuned circuits 66 and 82 because of the alternate conductive periods of diodes 60 and 76. Hence, the desired differences signal is developed between input terminals 72 and 88 of converter 74 by tuned circuits 66 and 82.

The following table indicates some of the operating characteristics for a circuit 10 operated in the "receive" mode, that was tested at an IF frequency of 1710 MH$_z$.

| RF = −10 dBm NOMINAL | LO = +7 dBm +/−.5 dB | IF Level | Conversion Loss | LO to IF Isolation |
|---|---|---|---|---|
| .4 MHz | 1.7104 GH$_2$ | −18 dBm | 8 dB | 30 dB |
| 2.0 | 1.712 | −18 | 8 | 30 |
| 8.0 | 1.718 | −18 | 8 | 31 |
| 32.0 | 1.742 | −18 | 8 | 41 |
| 100.0 (−10.2 dBm) | 1.810 | −19 | 8.8 | 42 |
| 200 (−10.4 dBm) | 1.91 | −19.2 | 8.8 | 25 |
| 300 (−10.4 dBm) | 2.01 | −19 | 8.6 | 20 |
| 400 (−10.4 dBm) | 2.11 | −18 | 7.6 | 19 |
| 500 (−10.5 dBm) | 2.21 | −18 | 7.5 | 15 |
| 600 (−11.5 dBm) | 2.31 | −19.5 | 8.0 | 14 |
| 700 (−11 dBm) | 2.41 | −18 | 7 | 14.5 |
| 800 (−11 dBm) | 2.51 | −18 | 7 | 15 |
| 900 | 2.61 | −17.5 | 7.5 | 16 |
| 1000 | 2.71 | −18 | 8 | 15 |

The conversion loss illustrated in the fourth column of the foregoing table is the difference between the power level of the input signal at terminal 14 and the power level of the resulting output signal at IF terminal 92. The measurements in the table were taken for a circuit 10 having components with the following values:

$C_{16} = 3.0$ picofarads
$C_{24} = 1.5$ picofarads
$C_{30} = 0.1$ microfarad
$C_{40} = 3.0$ picofarads
$C_{68} = C_{84} = 3.0$ picofarads
$L_{70} = L_{86} = 30$ mil $\times$ 220 mil microstrip line
$L_{36} = L_{38} = 15$ mil $\times$ 300 mil microstrip line
$L_{22} = 15$ mil $\times$ 230 mil microstrip line As indicated in the foregoing table of operating characteristics, circuitry 10 provides up to approximately 30 dB suppression of the local oscillator signal at terminal 92, for instance. To attain this high level of suppression, some prior art circuitry require expensive, doubly balanced mixers which generally are more complex and expensive than the mixer of circuit 10. Parallel tuned circuits 66 and 82 provide a high impedance at the IF frequencies and a low impedance path to ground for the local oscillator and the input signal. Balun 94 provides a high impedance between terminals 72 and 88 with respect to ground.

In the "transmit" mode of operation, as previously mentioned, a RF input signal is applied to terminal 92 and the local oscillator signal is applied to terminal 12. The mixing action of diodes 60 and 76 results in a frequency converted output signal at terminal 14. The output signal is selected by filter 34. The signal driving applied to terminal 92 may be either modulated or unmodulated.

Circuit 10 can be constructed by simple and low cost techniques. More specifically, high pass filter 20 and low pass filter 34 may be printed on a printed circuit board of the previously indicated dimensions. Furthermore, tuned circuits 66 and 82 also may be printed on the circuit board. The result is a low cost, efficient, mechanically sturdy well-balanced mixer.

Although the invention has been particularly shown and described with reference to a preferred embodiment, those skilled in the art will understand that changes in the form and details thereof may occur without departing from the scope of the present invention.

We claim:

1. A mixer circuit responsive to a first input signal having a first frequency and a second input signal having a second frequency to provide an output signal having a frequency which is a selected function of the first and second frequencies, the mixer circuit including in combination:
   first filter means adapted to receive the first input signal, said first filter means having a first bandpass characteristic including a first predetermined range of frequencies including the first frequency;
   second filter means adapted to receive the second input signal, said second filter means having a second bandpass characteristic including a second predetermined range of frequencies including the second frequency, said second predetermined range of frequencies being separated from said first predetermined range of frequencies;
   balanced mixer means coupled to said first filter means and to said second filter means, said mixer means combining said first and second input signals to provide, between output leads of said balanced mixer means, a plurality of signals including the output signal having a frequency which is the selected function of the first and second input signals; and
   frequency selecting means having an impedance maximum at the output signal frequency coupled between said output leads of said balanced mixer means, said frequency selecting means selecting the output signal.

2. The mixer circuit of claim 1 wherein:
   said first filter means is a high pass filter arranged to conduct said first predetermined range of frequencies; and
   said second filter means is a low pass filter arranged to conduct said second predetermined range of frequencies, said second predetermined range of frequencies being less than said first predetermined range of frequencies.

3. The mixer circuit of claim 2 wherein said first filter means includes in combination:
   an input terminal and an output terminal;
   reference conductor means;
   inductive means connected between said input terminal and said reference conductor means; and
   capacitive means connected between said input terminal and said output terminal.

4. The mixer circuit of claim 2 wherein said second filter means includes in combination:
   an input terminal and an output terminal;
   reference conductor means;
   inductive means coupled between said input terminal and said output terminal; and
   capacitive means coupled between said inductive means and said reference conductor means.

5. The mixer circuit of claim 1 wherein said mixer means includes first and second semiconductor diode means joined cathode to anode with a node therebetween coupled to the first and second filter means, and wherein terminals of the diode means not connected to the node are coupled to the output leads of the balanced mixer.

6. The mixer circuit of claim 1 wherein the output leads of the balanced mixer comprise first and second output leads and said frequency selecting means includes like first and second tuned circuits coupled, respectively, to the first and second output leads of the balanced mixer and to a reference conductor to provide a high impedance between the first and second output leads and the reference conductor at the output signal frequency and low impedance at the first and second frequencies.

7. The mixer circuit of claim 1 further including:
   transformerless balanced-to-unbalanced converter means coupled to said frequency selecting means.

8. A transformerless mixer circuit responsive to a first input signal having a first frequency and a second input signal having a second frequency to provide a desired output signal having a frequency which is a selected function of the first and second frequencies, the mixer circuit including in combination:
   first filter means adapted to receive the first input signal, said first filter means having a first bandpass covering a first predetermined range of frequencies including the first frequency;
   second filter means adapted to receive the second input signal, said second filter means having a second bandpass covering a second predetermined range of frequencies including the second frequency, said second predetermined range of frequencies being less than and separated from said first predetermined range;
   serially arranged diode means connected together at a node coupled to said first and second filter means, said diode means combining said first and second input signals to provide a plurality of signals including the output signal having a frequency which is the selected function of the first and second frequencies; and
   frequency selecting means for selecting the desired output signal, coupled to electrodes of said diode means not joined at the node and providing a high impedance therebetween at the frequency of the output signal and a low impedance at other frequencies.

9. The mixer circuit of claim 8 wherein said frequency selecting means includes first and second frequency selective circuits coupled, respectively, between first and second electrodes of the diode means not joined at the node and a reference conductor, wherein the first and second frequency selective circuits provide high impedance at the frequency of the output signal and low impedance at the first and second frequencies.

10. The mixer circuit of claim 9 wherein said frequency selecting means includes:
first and second parallel resonant circuit means coupled, respectively, between first and second electrodes of said diode means not joined at the node and a reference conductor means.

11. The mixer circuit of claim 10 further including balanced-to-unbalanced converter means having input terminals coupled to said first and second parallel resonant circuit means.

12. The mixer circuit of claim 8 wherein said first filter means further includes:
an input terminal and an output terminal;
reference conductor means;
first inductor means coupled between said input terminal and said reference conductor means; and
first capacitive means coupled between said input terminal and said output terminal.

13. The mixer circuit of claim 12 wherein:
said second filter means includes an input terminal and an output terminal;
second inductive means having an input terminal and an output terminal, said input terminal of said second inductive means being coupled to said input terminal of said second filter means;
third inductive means having an input terminal and an output terminal, said input terminal of said third inductive means being coupled to said output terminal of said second inductive means, said output terminal of said third inductive means being coupled to said output terminal of said second filter means;
second capacitive means coupled between said output terminal of said second inductive means and said reference conductor means; and
said output terminal of said first filter means being coupled to said output terminal of said second filter means so that said first capacitive means of said first filter means cooperates with said second filter means to provide said second bandpass characteristic and said second inductive means of said third filter means cooperates with said first filter means to provide said first bandpass characteristic.

14. The mixer circuit of claim 13 further including:
third capacitive means coupled to said input terminal of said first filter means;
means connected to said input terminal of said second filter means; and
said capacitive means tending to isolate said diode means from undesirable direct currents otherwise tending to flow therethrough.

* * * * *